United States Patent [19]

Kolbas

[11] Patent Number: 4,532,694
[45] Date of Patent: Aug. 6, 1985

[54] METHOD OF FABRICATING EMITTER/DETECTOR-IN-A-WELL FOR THE INTEGRATION OF ELECTRONIC AND OPTOELECTRONIC COMPONENTS

[75] Inventor: Robert M. Kolbas, Bloomington, Minn.

[73] Assignee: Honeywell Inc., Minneapolis, Minn.

[21] Appl. No.: 507,846

[22] Filed: Jun. 27, 1983

Related U.S. Application Data

[62] Division of Ser. No. 272,603, Jun. 11, 1981, abandoned.

[51] Int. Cl.³ .................... H01L 21/20; H01L 21/208
[52] U.S. Cl. ..................................... 29/569 L; 29/572; 29/576 E; 29/580; 148/171; 148/175; 148//DIG. 50; 148/DIG. 72; 357/16; 357/17; 357/30
[58] Field of Search ...................... 29/569 L, 572, 580, 29/576 E; 148/171, 175, DIG. 50, DIG. 72; 357/16, 17, 30

[56] References Cited

U.S. PATENT DOCUMENTS 3,978,428 8/1976 Burnham et al. ..................... 357/16

OTHER PUBLICATIONS

Tsang et al., *Applied Physics Letters* vol. 30, pp. 293-296, 1977.

Primary Examiner—Melvyn J. Andrews
Attorney, Agent, or Firm—Omund R. Dahle

[57] ABSTRACT

Integration of optoelectronic component and electronic components in a planar surface of a semi-insulating substrate such as gallium arsenide. A depression is etched into the planar surface to contain the transverse junction stripe laser structure which is grown by epitaxial layers. In the resulting structure the surface of the epitaxial layers forms a portion of the planar surface, thus placing the electrical and optical elements on or at the planar surface to facilitate fabrication and testing.

12 Claims, 5 Drawing Figures

ALGAAS
GAAS
ALGAAS
SUBSTRATE

|← 8.3μm →|

ALGAAS
GAAS
ALGAAS
SUBSTRATE

|← 8.3μm →|

METHOD OF FABRICATING EMITTER/DETECTOR-IN-A-WELL FOR THE INTEGRATION OF ELECTRONIC AND OPTOELECTRONIC COMPONENTS

This is a division of application Ser. No. 272,603, filed June 11, 1981, now abandoned.

BACKGROUND AND SUMMARY OF THE INVENTION

The present invention is directed to a novel planar structure GaAs electro-optic transmitter-receiver and to the method of fabrication. High speed low cost fiber optic communication systems will require a monolithic electro-optic transmitter-receiver. GaAs depletion mode MESFET logic is integratable with an AlGaAs-GaAs laser diode to form the transmitter of a fiber optic communication system.

In the prior art there has been described the growth of N type AlGaAs, GaAs, and AlGaAs layers successively on a semi insulating GaAs substrate for a semiconductor laser device such as shown in the U.S. Pat. Nos. 4,105,955, 4,166,278 and 4,183,038.

In the present invention a channel or depression is formed in the planar surface of a semi-insulating GaAs substrate; the channel is substantially filled with successive epitaxial layers of AlGaAs, GaAs, AlGaAs and GaAs which form the optoelectronic component (i.e. the transverse junction stripe laser or the detector), the surface of which top epitaxial layer is coplanar with (or substantially coplanar with) the substrate planar surface. The adjacent planar surface of the semi-insulating GaAs substrate contains cooperating MESFET electronics preferably fabricated by direct ion implantation. This placing of both the electrical and optical components on or at the planar surface simplifies processing steps and facilitates fabrication and testing.

DESCRIPTION

Figure 1:
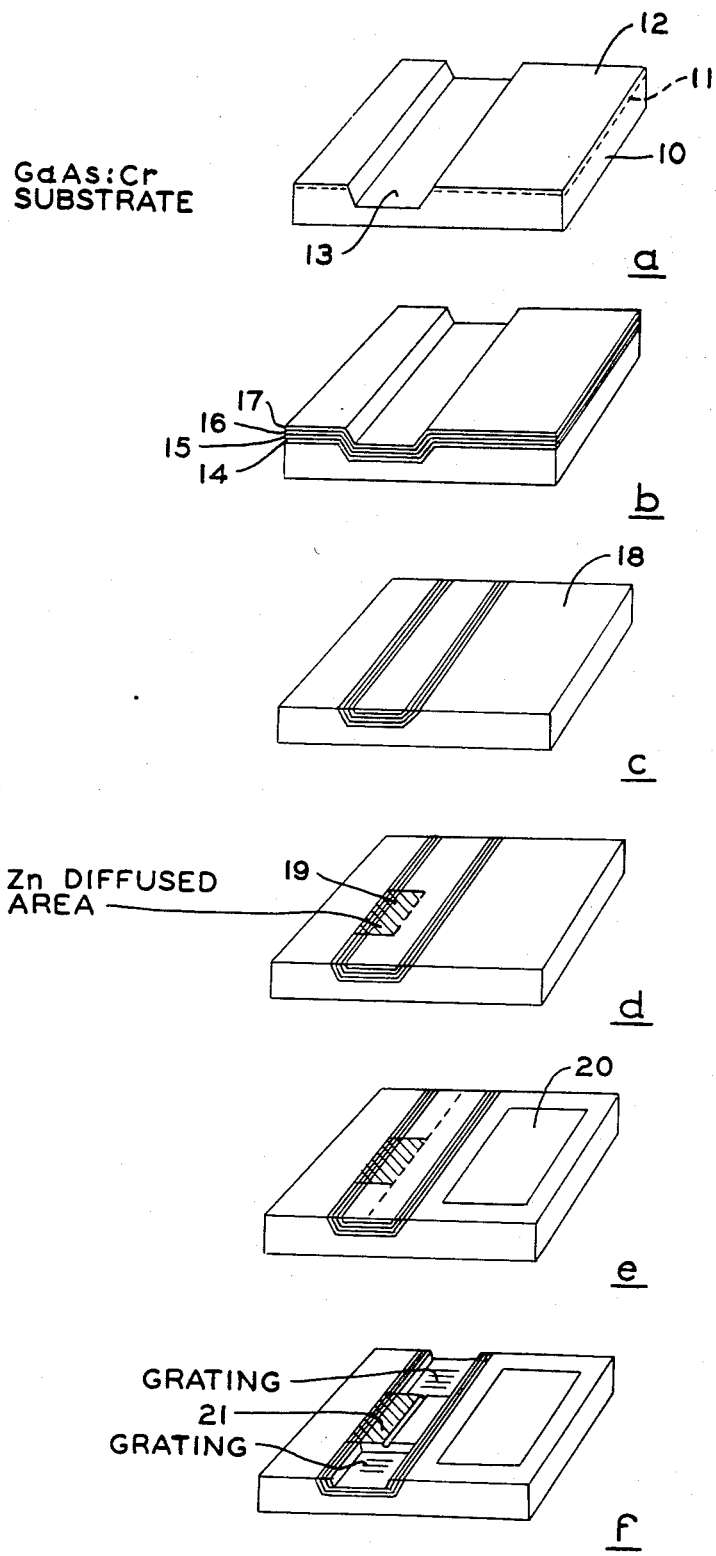
FIG. 1 describes a series of steps in the fabrication of the invention.

Referring now to FIG. 1 there is shown a progression of processing steps involved in the fabrication of the planar-structure GaAs electro-optic transmitter. FIG. 1a discloses a substrate 10 of semi-insulating GaAs, with an optional GaAs:Cr doped buffer 11, and having a planar surface 12. Etched into the planar surface of the substrate is a "wide-well" or channel 13 (for example 100-500 micron wide) to prepare a site for the laser structure. By way of example, the depth of the channel may be on the order of about 2–20 microns. Then by employing VPE (vapor phase epitaxy) or LPE (liquid phase epitaxy) growth the desired n-doped AlGaAs-GaAs-AlGaAs-GaAs epitaxial layers 14, 15, 16 and 17 are grown, as shown in FIG. 1b, over the planar surface 12 and the well 13. The thickness of the epitaxial layers 14–17 are adjusted such that a subsequent chemical-mechanical polishing step produces a new planar surface 18, shown in FIG. 1c, where the GaAs:Cr substrate is exposed and the layers 14, 15, 16 and 17 are preserved and remain only in the channel 13. These epitaxial layers grown in the wide well will provide the laser structure. The mechanical polishing exposes the GaAs:Cr substrate over the remainder of the planar surface 18. A mask of $Si_3N_4$ over the planar surface 18 with a window over a portion of the well area provides for a selective diffusion 19 of Zn into the well structure, as shown in FIG. 1d, in order to make the required p+, p and n regions needed for a transverse junction stripe (TJS) laser structure in the well. In one preferred embodiment the $Al_xGa_{1-x}As$ layers are $x=0.35$ and the GaAs layer 15 was Te-doped to a carrier concentration of approximately $2\times10^{18}$ cm$^{-3}$ on a substrate of GaAs oriented $<100>$. The Zn diffusion extends down through the epitaxial layers 17, 16, 15 and 14 to provide a p-n junction in the active GaAs layer 15.

Prior to MESFET fabrication by direct ion implantation the $Si_3N_4$ is removed and the surface is etched to remove surface damage. When the multiplexer and driver 20 are completed, FIG. 1e, the final processing steps are carried out to complete the laser. For illustrative purposes a TJS DBR (distributed Bragg reflector) laser 21 is shown in FIG. 1f. In the process steps outlined above, all contact lithographic processes are performed on planar surfaces to eliminate the problems encountered in processing non-planar surfaces such as non-uniform photoresist spin-on and mask alignment. Further, the temperature cycling, chemical etches and mechanical stress involved in the fabrication of the MESFETs and the lasers are compatible. Still further, since all the active components are at the surface, the electronic and the optical components can be developed independently during initial stages. The planar structure provides direct access to all the active components and facilitates testing and heat sinking.

Figure 2:
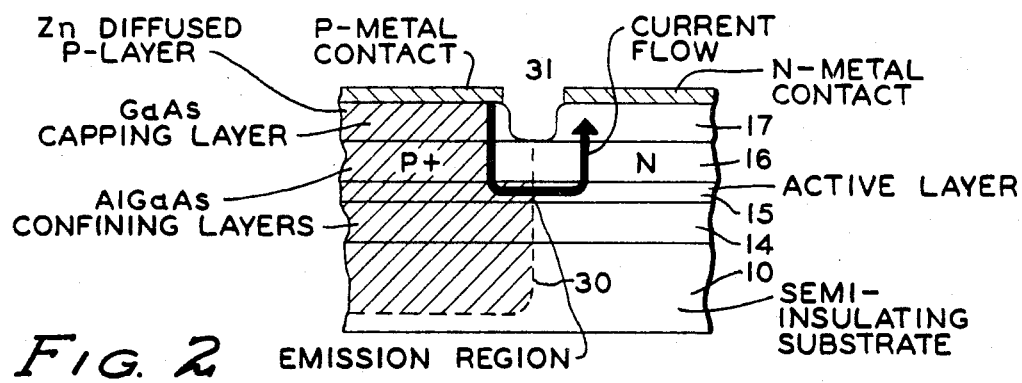
FIG. 2 is a cross-sectional representation of a portion of the structure.
Figure 3:
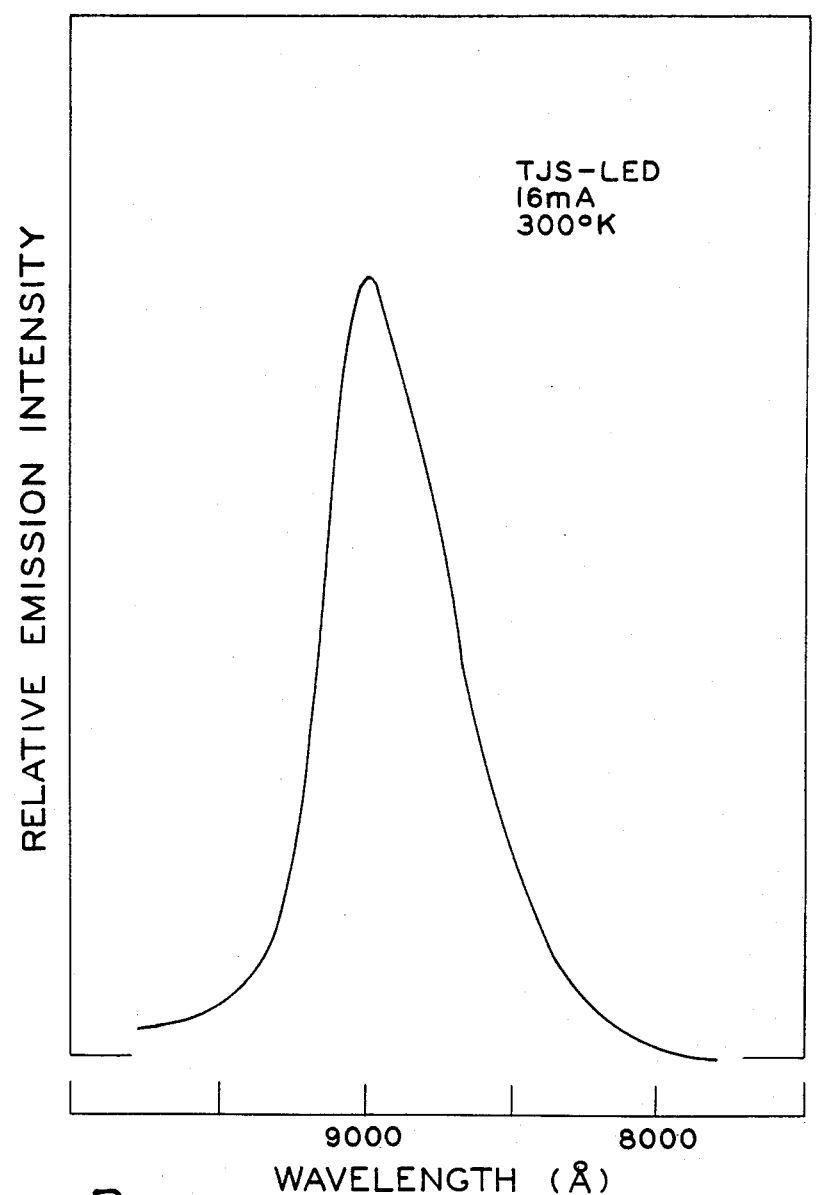
FIG. 3 is a graphical presentation of the relative emission intensity of the diode versus wavelength (A°).

FIG. 2 shows the details of a GaAs p-n homojunction emitter in the form of a Transverse junction stripe light emitting diode or laser diode fabricated in the well. The layer 10 shows the semi-insulating substrate, then the epitaxial layers including the AlGaAs confining layer 14, the GaAs active layer 15, the AlGaAs confining layer 16 and the GaAs cap layer 17. The layers 14–17 as deposited are n-layers. The cross-hatched portion of FIG. 2 represents the Zn diffused area, which is p doped, with the junction area being indicated by the dashed line 30. The heavy line 31 is indicative through the predominant current flow path through the diode. The junction can also be formed by the ion implantation of Be in place of the diffusion of Zn. FIG. 3 is a graphical presentation of spectral characteristics and plots the relative emission intensity of the diode on the ordinate axis versus wavelength (A°). It can be seen that in this AlGaAs-GaAs device the emission curve peaks at about 9000 A°.

Figure 4:
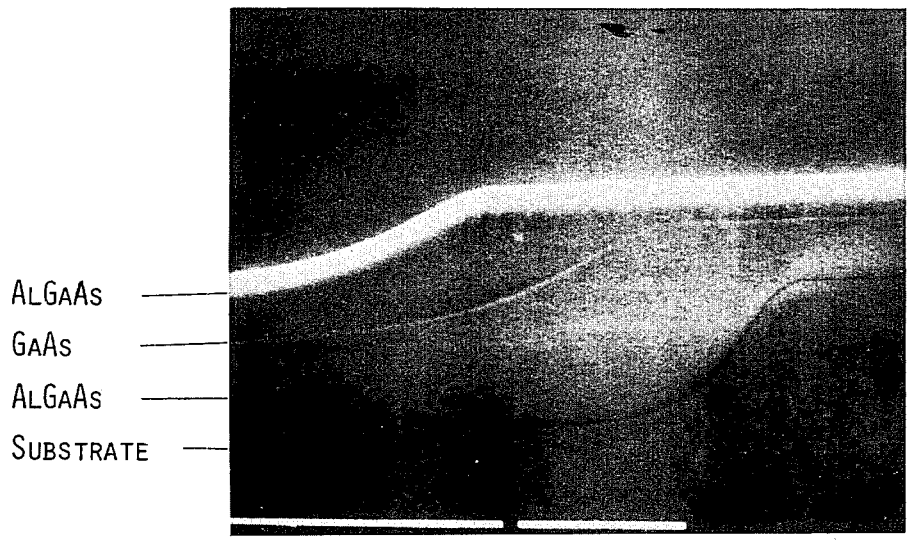
FIGS. 4 and 5 are photomicrograph presentations of the device cross-section.
Figure 5:

FIGS. 4 and 5 are photomicrographs of a cross-section of a transverse junction structure grown in an etched wide well. FIG. 4 shows the "as grown" AlGaAs, GaAs, AlGaAs structure on the substrate. Prior to the heteroepitaxial growth, wide-wells of 450 microns × 10 microns were formed by chemical etching in a $<100>$ oriented substrate structure. Subsequently a three layer TJS structure ($Al_xGa_{1-x}As=0.35$; GaAs active layer; $Al_xGa_{1-x}As=0.35$) was grown by liquid phase epitaxy on the entire surface as shown in FIG. 4. While the active layer is shown as GaAs throughout the description, it may also be $Al_{x'}Ga_{1-x'}As$ where the x' is not equal to zero. The planar surface was then restored, as shown in FIG. 5, by a chemical-mechanical polish in which the substrate is again exposed except in the well where the layered structure remains. The Zn diffusion described above can be performed either before or after restoration of the planar surface, however, it is preferable to perform the Zn diffusion with the epitaxial layers on the wafer to help protect the GaAs:Cr substrate.

Although the planar structure solid state electro-optic element has been described as fabricated in a GaAs system it may also be fabricated in the same way in a InP (indium phosphide) system. In this case the substrate is InP and the epitaxial layers may be the quaternary semiconductor InGaAsP of the general composition $In_{1-x}Ga_xP_{1-z}As_z$ and in which the respective values of x and z may differ from one layer to another and where $0 \leq x \leq 1$ and where $0 \leq z \leq 1$.

I claim:

1. A method of fabricating planar structured solid state electro-optic elements comprising the steps of:
   preparing a semi-insulating substrate having a substantially planar surface;
   etching a wide depression on the order of 100–500 microns wide in the planar surface of the substrate to prepare a site for an optoelectronic component;
   epitaxially growing over said depression and planar surface a thin semiconductor deposition to substantially fill said depression;
   chemical-mechanical polishing said epitaxially covered planar surface to re-expose said substrate and establishing a new planar surface which surface effectively includes the epitaxially grown deposition in said depression; and,
   doping a portion of said epitaxially grown deposition to form a diode, the diode being an active portion of the optoelectronic component.

2. The method according to claim 1 and further comprising the step of:
   ion implanting on a different portion of said new planar surface to fabricate MESFETs thereat by the direct ion implantation.

3. A method of fabricating planar structured optoelectronic elements comprising the steps of:
   preparing a semi-insulating substrate having a substantially planar surface;
   etching a depression in the planar surface of the substrate to prepare a site for an optoelectronic structure;
   epitaxially growing over said depression and planar surface first, second and third thin semiconductor layers of the general composition $Al_xGa_{1-x}As$ and in which x may differ from one layer to another;
   chemical-mechanical polishing said epitaxially covered planar surface to re-expose said substrate and establishing a new substantially planar surface which planar surface effectively includes the epitaxially grown layers in said depression; and,
   diffusing zinc down into a portion of said epitaxially grown layers and thereby forming a p-n junction, whereby the first and third layers are confining layers and the second layer is the active layer of a transverse junction stripe optoelectronic component.

4. The method according to claim 3 and further comprising the step of:
   ion implanting on a semi-insulating portion of said new planar surface to fabricate MESFETs thereat by the direct ion implantation.

5. The method according to claim 3 and further comprising the step of:
   annealing said device following the step of diffusing.

6. A method of fabricating planar structured GaAs optoelectronic elements comprising the steps of:
   preparing a semi-insulating GaAs substrate having a substantially planar surface;
   etching a wide depression on the order of 100–500 microns wide in the planar surface of the GaAs substrate to prepare a site for an optoelectronic structure;
   epitaxially growing in said depression thin layers of $Al_xGa_{1-x}As$ and $Al_{x'}Ga_{1-x'}As$ to thereby substantially fill said depression so that the surface of the epitaxial layers in said depression is substantially coplanar with said planar surface;
   chemical-mechanical polishing said epitaxially covered planar surface to re-expose said substrate and establishing a new planar surface which surface effectively includes the epitaxially grown deposition in said depression; and,
   doping a portion of said epitaxial thin film layers to form a diode, the diode region being an active region of the optoelectronic structure.

7. The method according to claim 6 in which the step of forming the diode region further comprises:
   diffusing zinc down into a portion of said epitaxially grown layers and thereby forming a p-n junction, whereby the $Al_xGa_{1-x}As$ layers are confining layers and the $Al_{x'}Ga_{1-x'}As$ layer is the active layer of a transverse junction stripe laser.

8. The method according to claim 6 and further comprising the step of:
   ion implanting on a semi-insulating portion of said planar surface to fabricate MESFETs thereat by the direct ion implantation.

9. The method according to claim 7 and further comprising the step of:
   annealing said device following the step of diffusing.

10. The method according to claim 1, 3 or 6 wherein the depression is on the order of 2–20 microns deep.

11. A method of fabricating planar structured solid state electro-optic elements comprising the steps of:
    preparing a semi-insulating substrate having a substantially planar surface;
    etching a wide depression on the order of 100–500 microns wide in the planar surface of the substrate to prepare a site for an optoelectronic component;
    epitaxially growing over said depression a thin semiconductor deposition to substantially fill said depression;
    chemical-mechanical polishing said epitaxially covered planar surface to re-expose said substrate and establishing a new planar surface which surface effectively includes the epitaxially grown deposition in said depression; and,
    doping a portion of said epitaxially grown deposition to form a diode, the diode being an active portion of the optoelectronic component.

12. The method according to claim 11 and further comprising the step of:
    ion implanting on a different portion of said planar surface to fabricate MESFETs thereat by the direct ion implantation.

* * * * *